United States Patent
Farrell et al.

(10) Patent No.: US 7,436,864 B2
(45) Date of Patent: Oct. 14, 2008

(54) METHOD FOR OPTIMISING THE CALIBRATION PROCESS OF A TUNEABLE LASER

(75) Inventors: Thomas Farrell, Dublin (IE); Neil Ryan, Dublin (IE); John Levins, Dublin (IE); Tommy Mullane, Dublin (IE)

(73) Assignee: Intune Technologies Limited (IE)

( * ) Notice: Subject to any disclaimer, the term of this patent is extended or adjusted under 35 U.S.C. 154(b) by 306 days.

(21) Appl. No.: 10/507,328

(22) PCT Filed: Mar. 11, 2003

(86) PCT No.: PCT/IE03/00041

§ 371 (c)(1),
(2), (4) Date: Sep. 19, 2005

(87) PCT Pub. No.: WO03/077382

PCT Pub. Date: Sep. 18, 2003

(65) Prior Publication Data

US 2006/0072631 A1    Apr. 6, 2006

(30) Foreign Application Priority Data

Mar. 11, 2002  (IE) ............................... S2002/0187

(51) Int. Cl.
*H01S 3/10* (2006.01)
*H01S 3/13* (2006.01)

(52) U.S. Cl. .............................. 372/20; 372/28; 372/32
(58) Field of Classification Search ................ 372/20, 372/28, 29.02, 32
See application file for complete search history.

(56) References Cited

U.S. PATENT DOCUMENTS 5,812,572 A    9/1998   King et al. .................... 378/38

FOREIGN PATENT DOCUMENTS

| WO | WO 99/40654 | * | 8/1999 |
| WO | WO 99/40654 A | | 8/1999 |
| WO | WO 00/54380 A | | 9/2000 |

OTHER PUBLICATIONS

International Search Report for Application No. PCT/IE03/00041 completed Apr. 5, 2004.

* cited by examiner

*Primary Examiner*—Armando Rodriguez
(74) *Attorney, Agent, or Firm*—McDonnell Boehnen Hulbert & Berghoff LLP (57) ABSTRACT

A method relating to the calibration of tuneable lasers is described. The method provides for the provision of correct control currents so as to achieve each of desired output frequencies from the laser. The correct currents are determined by forming a matrix of the output characteristics of the laser at specific tuning currents and processing that matrix to determine stable operating points within the matrix.

17 Claims, 4 Drawing Sheets

METHOD FOR OPTIMISING THE CALIBRATION PROCESS OF A TUNEABLE LASER

FIELD OF THE INVENTION

The invention relates to tuneable lasers, particularly to a multi section laser diode that can be switched between different wavelengths or frequencies and more particularly to a method adapted to provide for the correct control currents to achieve each of the desired output frequencies from the laser.

BACKGROUND TO THE INVENTION

Multi section laser diodes are well known in the art and can be switched between different wavelengths. Typically the diode is calibrated at manufacture to determine the correct control currents that should be applied to the laser so as to effect the desired output frequencies from the laser.

One of the first known multi-section laser diodes is a three-section tuneable distributed Bragg reflector (DBR) laser. Other types of multi-section diode lasers are the sampled grating DBR (SG-DBR), the superstructure sampled DBR (SSG-DBR) and the grating assisted coupler with rear sampled or superstructure grating reflector (GCSR). A review of such lasers is given in Jens Buus, Markus Christian Amann, "*Tuneable Laser Diodes*" Artect House, 1998 and "*Widely Tuneable Semiconductor Lasers*" ECOC'00. Beck Mason.

Figure 1:
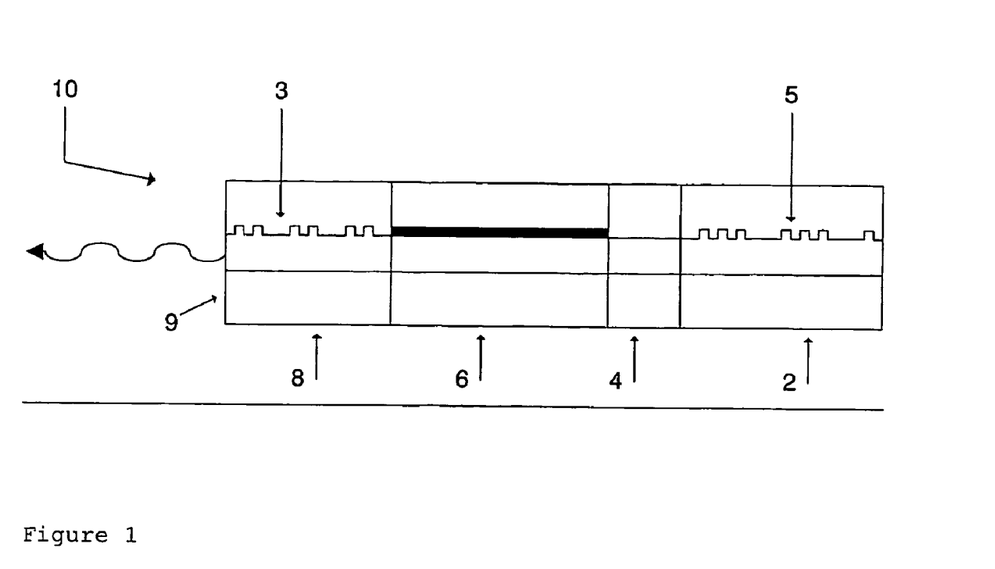
FIG. 1 is a schematic drawing of a known laser diode.

FIG. 1 is a schematic drawing of a SG-DBR 10. The laser comprises of back and front reflector sections 2 and 8 with an intervening gain or active section 6 and phase section 4. An anti-reflection coating 9 is usually provided on the front and rear facets of the chip to avoid facet modes. The back and the front reflectors take the form of sampled Bragg gratings 3 and 5. The pitch of the gratings of the back and front reflectors vary slightly to provide a Vernier tuning effect through varying the current supplied to these sections. The optical path length of the cavity can also be tuned with the phase section, for example by refractive index changes induced by varying the carrier density in this section. A more detailed description of the SG-DBR and other tuneable multi-section diode lasers can be found elsewhere Jens Buus, Markus Christian Amann, "*Tuneable Laser Diodes*" Artect House, 1998.

Multi-section diode lasers are useful in wavelength division multiplexed (WDM) systems. Example applications are as transmitter sources, as wavelength converters in optical cross connects (OXCs) and for reference sources in heterodyne receivers. Typically, WDM systems have channel spacing conforming to the International Telecommunications Union (ITU) standard G692, which has a fixed point at 193.1 THz and inter-channel spacing at an integer multiple of 50 GHz or 100 GHz. An example dense WDM (DWDM) system could have a 50 GHz channel spacing and range from 191 THz to 196 THz (1525-1560 nm).

As these are multi-section lasers they require some calibration before use to determine the correct values of current to achieve each of the desired output wavelengths of the tuneable laser. For example an SG-DBR laser has 4 sections. If each of these sections has a 300 possible values of current (0-90 mA in steps of 0.3 mA) and as each of the sections of the laser are interdependent on the output of the laser there are 300×300×300×300 possible combinations of current that can be applied to the laser.

Added to this the laser must also meet the requirements for line width, SMSR etc. This means that the laser must be calibrated and a lookup table of currents obtained where each entry in the table consists of the currents required to achieve each wavelength in the frequency plan. Each of these entries are called operating points.

The manufacturing process of tuneable lasers is not fully mature and each device will have its own unique wavelength signature which means that each device is sufficiently different to require a full calibration and data from another laser will not work. This means that each device must be fully calibrated to obtain the lookup table and this table must be used with the device when in operation.

Several techniques to obtain this lookup table of information have been published including "Fast Generation of Optimum Operating Points for Tuneable SG-DBR Laser over 1535-1565 nm Range" John Dunne et al. *Conference on Lasers and Electroptics (CLEO)* Baltimore, May, 1999 p 147-148 proceedings, "Fast Accurate Characterisation of a GCSR laser over the complete EDFA Band" Tom Farrell et al. *LEOS'99* November, San Francisco, "Control of widely tuneable SSG-DBR lasers for dense wavelength division multiplexing" Gert Sarlet, G. Morthier, R. Baets *J. Lightwave Technol.* vol. 18, no. 8, pp 1128-1138, August 2000, and also in patent WO 00/54380. The first publication mentioned above also utilises a measurement set-up such as that shown in FIG. 2. The apparatus comprises a laser 600 which is controlled by current sources and a temperature control element 610. The output of the laser is passed through a first coupler 620, so as to provide a portion of the output to a wavelength meter 630 and a second portion to a second coupler where it is split further. A first portion of the split light output is passed directly to a first photodiode (photodiode A), whereas the second portion passes through a linear filter and the filtered signal is then detected using photodiode B. By dividing the detected voltage level at photodiode B (which is proportional to the amount of light arriving at photodiode A) by the detected voltage at photodiode A, a value is obtained that is proportional to the wavelength of the light emitted by the laser. Either the value measured by the wavelength meter or the value of photodiode B divided by photodiode B can be used as the wavelength of the light emitted by the laser.

While these methods offer solutions to the general concept of calibration, they are over complicated as they involve many operations and parameters (typical numbers for conventional systems is anything between 10 and 20) to guide the calibration process. Inevitably this leads to several parameters that control the calibration and these are sensitive to particular device structures and cannot cope with device variation of a production line. Also these parameters will often be interdependent leading to a multidimensional space to set up the calibration where only a small subset of the possible parameters will provide good calibration results on the tuneable laser. Ideally the calibration should have a small set of parameters that greatly simplifies the calibration and its dependency on particular device characteristics.

There is therefore a need to provide a method that enables constant and accurate results to be obtained so as to provide for a process control of the calibration process.

OBJECT OF THE INVENTION

It is an object of the present invention to provide a process control system for ensuring accurate calibration of laser diodes.

SUMMARY OF THE INVENTION

Accordingly, the present invention provides a method of calibration of a multi-section tuneable laser diode to a specific frequency grid with a small set of parameters to control this process. The methodology and technique of the present invention is advantageous in that it is generic and can be applied to several types of tuneable lasers such as DBR, SG-DBR, SSG-DBR, GCSR etc.

This generic approach to the core calibration algorithm can be used to reduce the number of calibration parameters to a smaller set of values than heretofore possible.

Using the methodology of the present invention assumptions are not made of the specific type of mode jumps that occur in a laser and all are treated instead as regions of instability where the laser should not be operated. The present invention provides a technique whereby all possible operating points of the laser are obtainable and it is straightforward to obtain a quality parameter for each of the operating points so as to ascertain its stability in that operating region. This can then be used as a basis for a screening method so as to effect a selection of operating points that fall within a predefined criteria range.

The method of the present invention enables the performance of the calibration to be checked without requiring the determination of a full set of calibrations at all possible calibration parameter values.

In accordance with a first embodiment of the present invention a method of calibrating a multi-section tuneable laser to a specific frequency grid is provided, the method comprising the steps of:
 forming a first discrete matrix of output values from the laser, the matrix being defined by an optical characteristic of the output of the laser at specific determining tuning currents, and
 processing the matrix so as to determine stable operating points within the matrix, the stable operating points defining specific frequencies where the laser may be operated.

The invention additionally provides a method of calibrating a tuneable laser, the method comprising the steps of:
 forming a first discrete matrix of output value from the laser, the output values being defined by values of at least one optical characteristic of the output of the laser as determined at specific tuning currents, and
 processing the matrix so as to determine stable operating points within the matrix, the stable operating points defining specific frequencies where the laser may be operated.

The output values from the laser are desirably measurements indicative of the characteristics of the laser, the characteristics being selected from one or more of the following:
 the output power of the laser,
 the wavelength of the laser,
 the SMMR of the laser,
 the linewidth, or
 some other laser characteristics.

Typically the first matrix is determined by measuring the output values from the laser as a function of coarse tuning currents of the laser.

The matrix typically may be viewed graphically as a plane of values relating to the output power of the laser at specific controlling tuning parameters.

Desirably the step of processing the matrix includes the steps of:
 defining regions within the matrix where an edge or discontinuity is present, and
 determining points which are bounded by discontinuities or edges, the points determined representing stable operating regions for the specific tuning parameters.

The step of defining regions within the matrix where an edge of discontinuity is present is desirably performed by effecting an edge detection on the matrix values, the edge detection effecting the formation of a processed matrix set of values, the processed matrix set of values having values indicative of whether an edge is present.

The edge detection is desirably effected by:
 processing the matrix using a filter algorithm in a direction substantially equivalent to the direction of mode jumps of the laser output,
 determining a set of maximum points within the filtered matrix,
 determining a set of minimum points within the filtered matrix,
 establishing a set of maximum and minimum pairs,
 determining the difference between the maximum and minimum of each pair so as to provide a plurality of difference values, and
 thresholding the difference values determined such that those point pair values greater than a certain threshold value are areas which are contributing to an edge within the matrix.

The thresholding is desirably performed using the value of the mode jump parameter as a threshold value. The value of this may be determined by arbitrarily selecting a sequence of values and selecting the value which provides the best result.

Other measurements may additionally be made such as the use of a coarse wavelength filter to convert wavelength changes in the laser to power changes. As the power through the filter is proportional to the input power and the wavelength, by dividing the input power into the power output of the filter a value proportional to wavelength is determined. Similar techniques described above or a simple Laplacian operation and threshold can extract more edges from the laser and result in an edge matrix which can be combined to the previous matrix using a logical OR operator to provide more robust results and guarantee the detection of all edges. It will be noted that just using the coarse wavelength filter measurement alone will not provide comprehensive edges for all mode jumps of the laser, but may be considered sufficient or satisfactory for certain applications.

The step of defining stable operating points within the matrix set of values is typically effected by performing a distance map operation on the processed matrix set so as to determine distances between adjacent edges and selecting those points which are in the centre of the region bounded by the edges.

The method may additionally provide the process of determining whether each stable operating point obtained represents the optimum stable operating point for that mode, the process including the following steps:
 dilating the set of points that are defined as contributing to an edge in the edge matrix thereby forcing the edges to join where gaps exist,
 determining whether more than one operating point resides in each dilated bounded region, and
 if more than one operating point is found in the dilated bounded region, measuring the frequency of the laser at these points,
 determining whether the difference between the measured frequency of the laser and the mode jump spacing is within a predetermined value and, if it is within the value, averaging the plurality of operating points to provide a single operating point within that bounded region or if it is not within that predetermined value, allowing for a plurality of points within that region.

It will be appreciated that the mode jump spacing is a physical characteristic of all such tuneable devices and is dependent on the main Fabry Perot cavity set up in the laser diode.

It will be further appreciated that each operating point lies in a region bounded by dilated edges, and that if a point is determined to be the sole occupier of such a region and no other operating point lies in the same bounded region then this operating point is optimised.

The method may additionally provide for a repetition of the one or more of the preceding steps at different tuning parameters so as to provide a plurality of matrices, each matrix being indicative of a set of operating points for a particular set of tuning parameters facilitating the linking of operating points from different matrices so as to form a continuous tuning region.

The linking of points between two different matrices is typically effected by joining points that meet the criteria that a point from a first matrix and a point from a second matrix are joined if the point from the second matrix has a larger front and back current but these currents are within a predetermined distance value of the two operating points.

This predetermined distance value is easily obtained from the characteristics of the devices as it is dependent on the tuning efficiency of the coarse wavelength tuning sections of the laser. This, it will be appreciated, can be approximated by selecting a value greater than the current on the front and/or back that causes the laser to step from one wavelength to another.

Alternatively, the frequency of each operating point may be measured and those operating points that are adjacent and have a frequency difference within a predetermined range are joined. This it will be appreciated forms a tuning rate parameter, which defines the largest amount by which frequencies can differ and yet still be joined.

In accordance with another embodiment of the present invention a method is provided comprising the steps of:
 a) effecting a measurement of a first set of operating points for single phase current,
 b) plotting this first set of operating points as a function of a mode jump parameter,
 c) repeating steps a) and b) for a plurality of phase currents, and
 d) analysing the resultant graph and determining a median mode jump parameter that may be used for all planes of the laser diode.

These and other features of the present invention will be better understood with reference to the following drawings.

DETAILED DESCRIPTION OF THE DRAWINGS

The present invention provides a method of calibrating a multi-section tuneable laser diode to a specific frequency grid with a small set of parameters controlling the process. The technique is generic and can be applied to several types of tuneable lasers such as DBR, SG-DBR, SSG-DBR, GCSR etc.

The techniques used by the method of the present invention are not based on assumptions with regard to specific type of mode jumps that occur in the laser. According to the present invention mode jumps are treated as regions of instability where the laser should not be operated. Furthermore, all the possible operating points of the laser are obtained along with a corresponding quality parameter for each of the operating points to quantify its stability. Then a screening method can be implemented to select operating points that meet a certain criterion.

Figure 3:
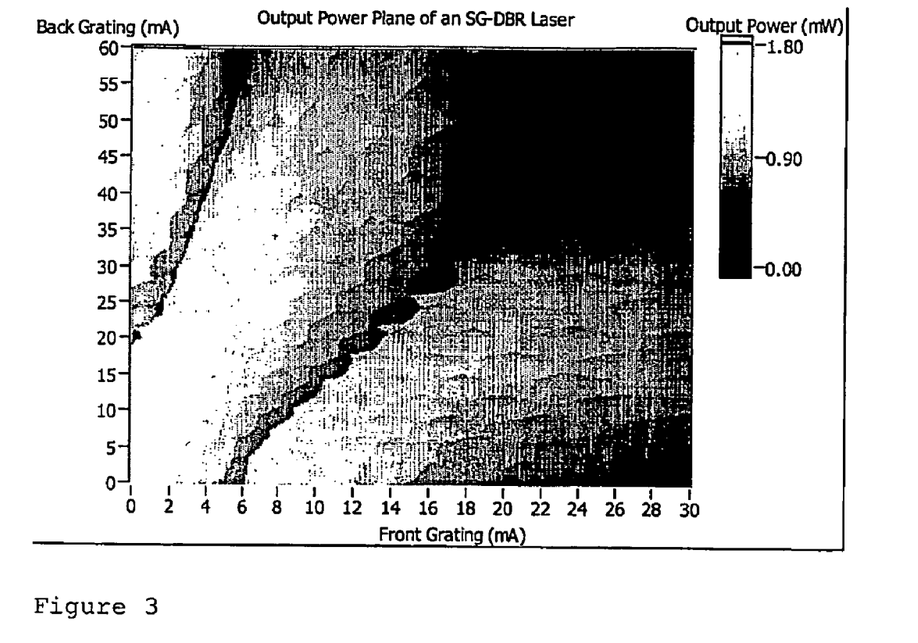
FIG. 3 shows an output power plane of a laser diode as measured according to two tuning currents.

In preferred embodiments of the present invention several measurements are performed on the laser. These are measuring the output power vs. all of the coarse tuning currents, i.e. for a 4 section SG-DBR laser this results in a plane. FIG. 3 shows an output power plane of a laser according to two tuning currents.

This plane can be obtained using a coarse wavelength selective element using suitable techniques such as those described in "Fast Accurate Characterisation of a GCSR laser over the complete EDFA Band" Tom Farrell et al. *LEOS'99* November, San Francisco. These measurements are repeated as a function of any other tuning sections that the device may have. For example, with an SG-DBR laser several planes are measured of Front grating vs. Back grating against phase current.

Figure 4:
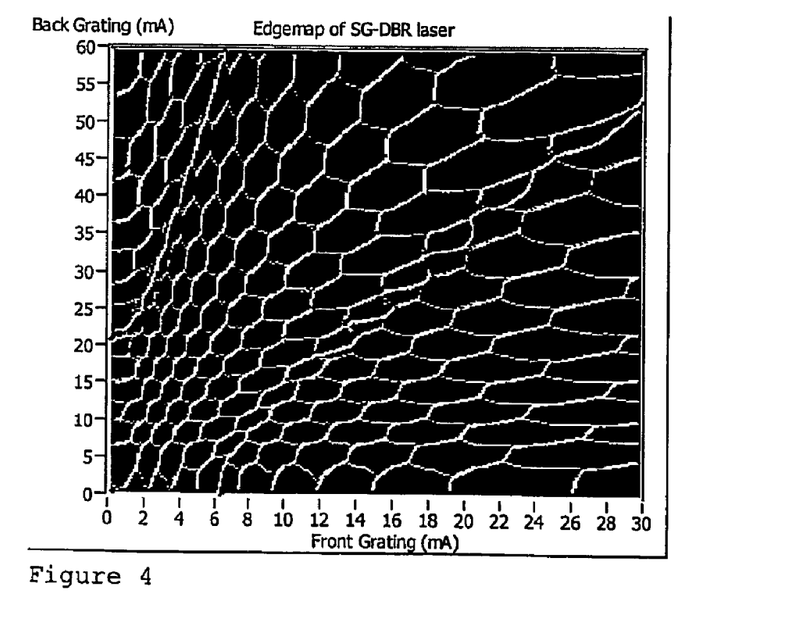
FIG. 4 shows a graphical representation of a matrix as formed according to the method of the present invention.

Each of these planes are then processed to obtain the stable operating points available at that particular phase current. This is performed by the following steps:

1. Perform an edge detection algorithm which will produce a similar sized plane where the pixels are turned on if there is an edge and off if there is no presence of an edge at the corresponding location in the plane. An example of such a plane is shown in FIG. 4,
2. Perform a distance map operation on the edge map,
3. Select the peaks of the edgemap,
4. Join peaks in the edgemap which are closer together than the sum of their two distance map values.

The edge detection can be performed usually in two steps. The first step is to pass a high pass filter such as those of the type [−1 −2 0 2 1] or of the 2-D type $$\begin{bmatrix} 1 & 2 & 1 \\ 0 & 0 & 0 \\ -1 & -2 & -1 \end{bmatrix}.$$

across each plane in the predominant direction of the mode jumps. Then, by following in the direction of the filter and looking for a max. to min. set of points in the line, a group of max./min. and difference points can be obtained. This is performed by looking for local maximum where the point being considered is higher or equal to the points on either side. Similarly local minima are located by looking for a point that is less than or equal to the points on either side.

Then in the same direction as the filter was passed through the data it is possible to locate max. to min. pairs. For each of these pairs we record the value at the max. and the min. and subtract one from the other. This is called the difference value. By thresholding this value using the mode jump parameter we allow max. to min. jumps of a certain size to be accepted as a edge. An alternative to using a fixed thresholding parameter to extract the edges is to use a histogram optimisation or K-means algorithm to select the correct threshold. The selected mode jump parameter can be selected on the basis of analysis of performance of one or more mode jump parameters and using the parameter that results in the optimum performance. This can be seen in FIG. 4, which shows an edgemap of a SG-DBR laser.

It will be appreciated that the mechanism performs equally well on all edges that are obtained from mode jumps in tuneable lasers.

If we calculate the effects of this filter on data $[x_0, x_1, x_2, \ldots, x_{n-2}, x_{n-1}, x_n, x_{n+1}, x_{n+2}, \ldots]$ using a filter having a filter value such as $[-1,-2,0,2,1]$ it will be appreciated that the function:

$$f(n) = -x_{n-2} - 2x_{n-1} + 2x_{n+1} + x_{n+2}$$

where f(n) is the result at n after the filter operation is performed effects a resultant relationship:

$$f(n) = 2\left(\left(\frac{x_{n+2} - x_{n-2}}{2}\right) + (x_{n+1} - x_{n-1})\right)$$

This corresponds to the slope of the points around the centre point i.e. the slope of points $x_{n-1}, x_{n+1}$ and the slope of $x_{n-2}, x_{n+2}$ as:

$$m_1 = \frac{x_{n+1} - x_{n-1}}{(n+1) - (n-1)} =$$

$$m_1 = \frac{x_{n+1} - x_{n-1}}{2},$$

$$m_2 = \frac{x_{n+2} - x_{n-2}}{(n+2) - (n-2)} =$$

$$m_2 = \frac{x_{n+2} - x_{n-2}}{4}$$

By combining the two slopes it can be shown that:

$$m_1 + m_2 = \frac{x_{n+2} - x_{n-2}}{4} + \frac{x_{n+1} - x_{n-1}}{2}$$

$$m_1 + m_2 = \frac{1}{2}\left(\frac{x_{n+2} - x_{n-2}}{2} + (x_{n+1} - x_{n-1})\right).$$

It will be appreciated therefore that $f(n)=4(m_1+m_2)$ i.e. the filter response is equal to four times the sum of the two sets of slopes about the centre point.

The next step is to find the local max. and min i.e.

$$f_{max}(n_{max}) = f(n_{max}), \text{ where } f(n_{max}) \geq f(n_{max} \pm 1)$$

and $$f_{min}(n_{min}) = f(n_{min}), \text{ where } f(n_{min}) \geq f(n_{min} \pm 1)$$

and the difference value d is $$d = f_{max}(n_{max}) - f_{min}(n_{min}), \text{ where } n_{min} > n_{max} \text{ and } n_{min} - n_{max} \text{ is minimised}$$

Therefore an edge is present when $d > P_{mj}$ where $P_{mj}$ is the mode jump parameter.

Figure 6:
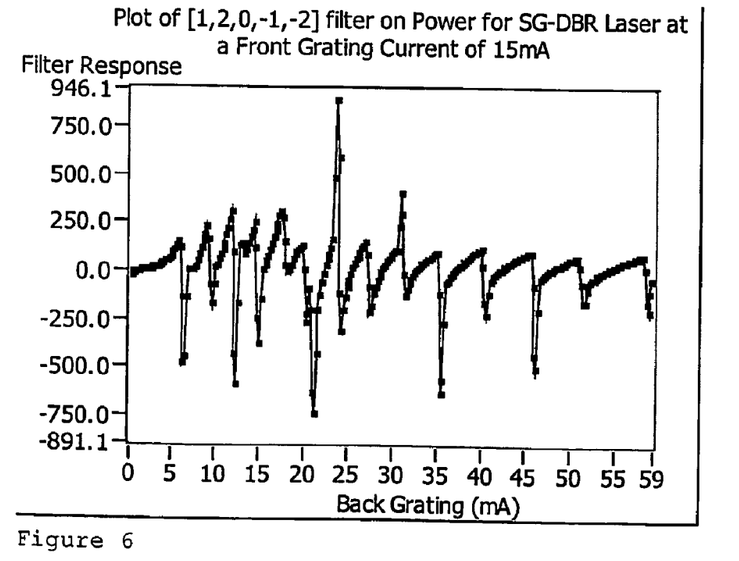
FIG. 6 is a graphical representation of the output of the filter used to detect the mode jumps of the laser according to a method of the present invention.

FIG. 3 shows a power plane of an SG-DBR laser as a function of the two coarse tuning currents (Front grating and Back grating). A line is taken from the plane in the direction we are looking for mode jumps i.e. a fixed front grating current. FIG. 6 shows one of these lines after passing the filter $[-1,-2,0,2,1]$ across it. This will then be thresholded using the techniques described above to obtain all points contributing to edges.

The result of this when repeated for all front grating current values is shown in FIG. 4.

A distance map operation is performed next where D(x,y) is the distance from (x,y) to the nearest edge. There are some examples of how to perform this in "Control of widely tuneable SSG-DBR lasers for dense wavelength division multiplexing" Gert Sarlet, G. Morthier, R. Baets *J. Lightwave Technol.* vol. 18, no. 8, pp 1128-1138, August 2000. By locating the distance map peaks i.e. where $D(x,y) \geq D(x\pm 1, y\pm 1)$ it is possible to obtain the centre of the regions bounded by edges. In many cases multiple local max. peaks will be found and these can be merged using the following rule.

$$\text{Merge if } D(x_{max1}, y_{max1}) + D(x_{max2}, y_{max2}) \leq \sqrt{(x_{max1} - x_{max2})^2 + (y_{max1} - y_{max2})^2}$$

Figure 5:
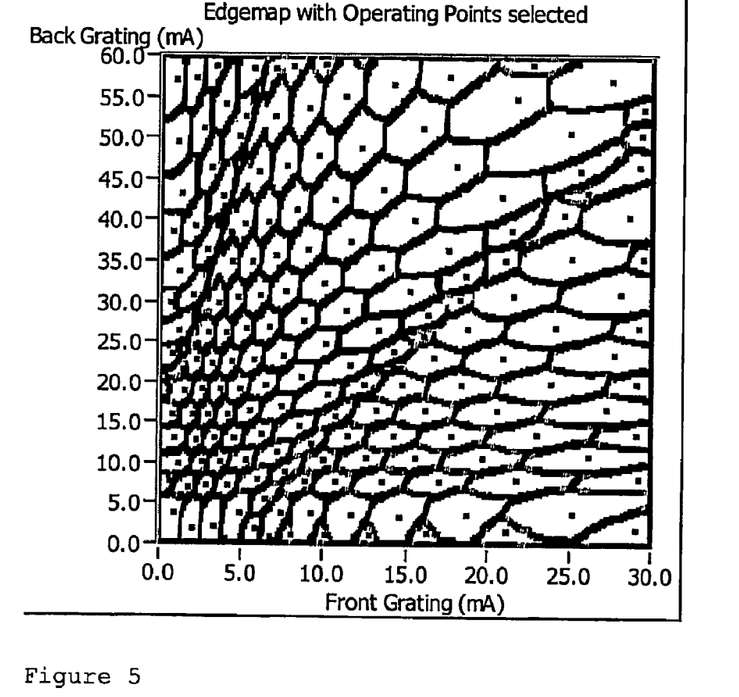
FIG. 5 is a graphical representation of a processed matrix identifying operating points according to the present invention.

Following this we obtain a set of points which are in the centre of regions bounded by edges. These points are operating points of the laser for that phase and gain current, and are shown in FIG. 5 which is the corresponding edgemap to FIG. 4 with the operating points selected.

As a final check on the operating points gathered, the edge map can be dilated by one pixel and then broken into regions bounded by mode jumps. If more than one operating point found in the distance map is in any of the regions found above then the frequency of the laser at these points should be measured. Any points which have a frequency difference of less than 10% of the mode jumps spacing is the same point and they can be averaged to obtain only one point. Points which have a large frequency difference are allowed as they are different operating points.

Figure 7:
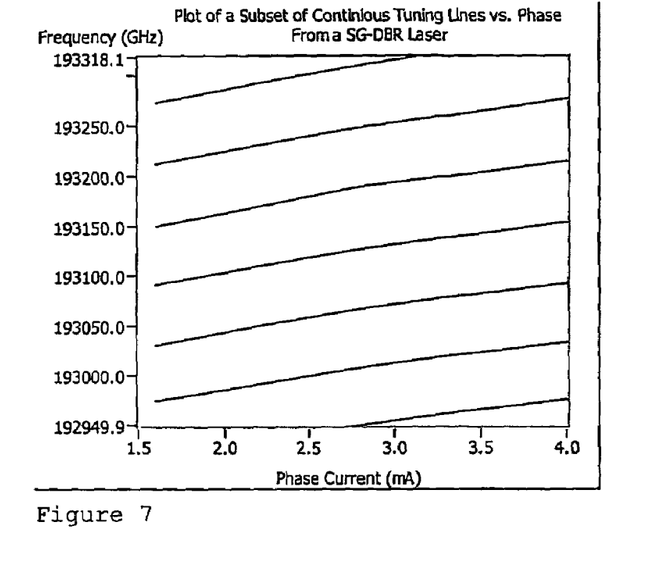
FIG. 7 shows a sub-set of the continuous tuning regions of a laser as a function of phase current.
Figure 8:
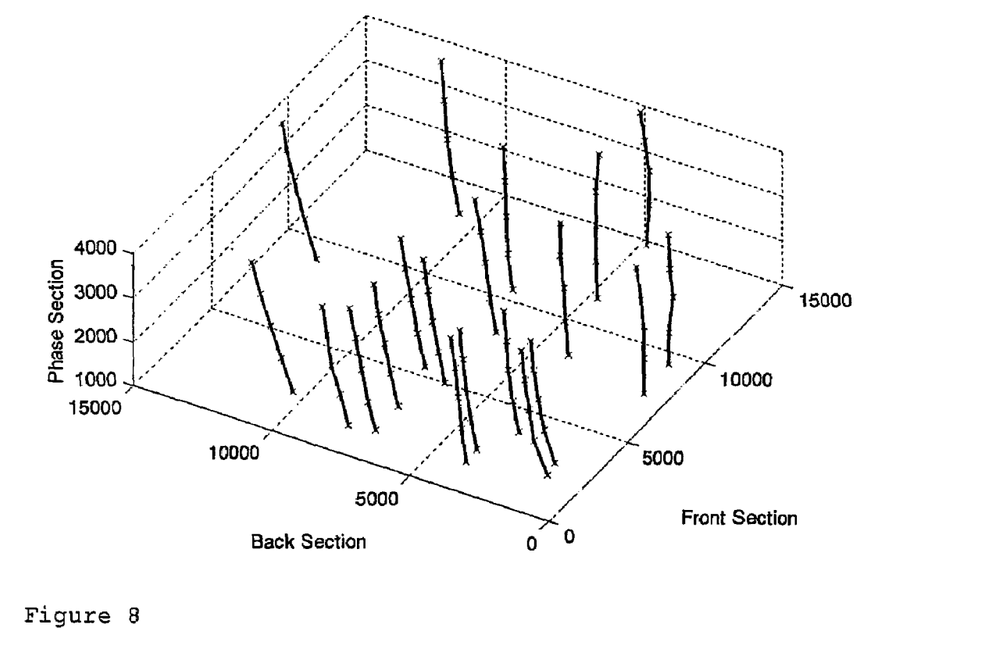
FIG. 8 shows a subset of the continuous tuning regions of a laser as a function of the two coarse tuning currents and the fine tuning current, Front grating, Back Grating and Phase section respectively for an SG-DBR laser.

The next stage after the above has been performed on all measured planes is to join operating points that have continuous tuning between them. Examples of the continuous tuning lines are shown in FIGS. 7 and 8. This is performed by taking the first plane (at the lowest phase current) and joining operating points that meet the following criterion: "a point from the lower phase current and a point from the higher phase current, where the higher phase current point has larger front and back currents but these currents are within the average distance map peak values of the two operating points".

Figure 2:
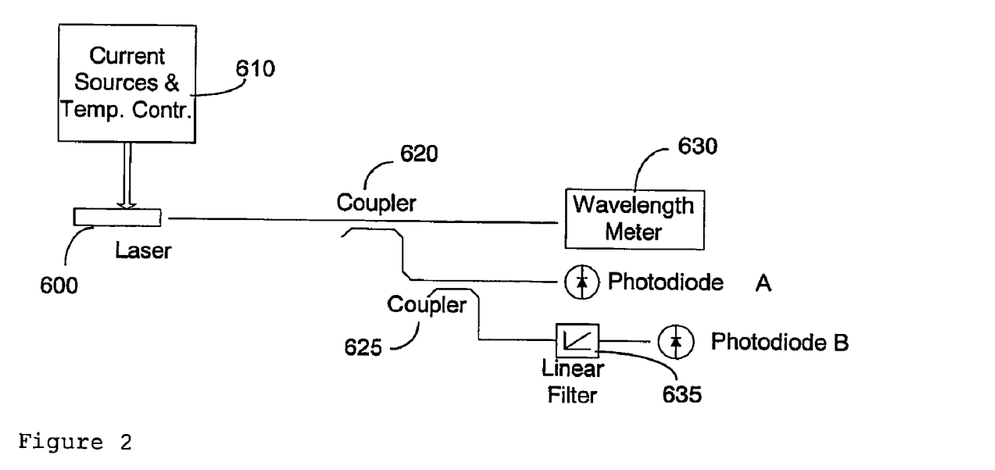
FIG. 2 shows a measurement set-up for measuring frequencies and power of a tuneable laser.

Alternatively, the frequency of each operating point can be measured using a wavelength meter in an known arrangement such as that described in FIG. 2.

As detailed previously the apparatus comprises a laser 600 which is controlled by current sources and a temperature control element 610. The output of the laser is passed through a first coupler 620, so as to provide a portion of the output to a wavelength meter 630 and a second portion to a second coupler 625 where it is split further. A first portion of the split light output is passed directly to a first photodiode (photodiode A), whereas the second portion passes through a linear filter 635 and the filtered signal is then detected using photodiode B.

By dividing the detected voltage level at photodiode B (which is proportional to the amount of light arriving at photodiode A) by the detected voltage at photodiode A, a value is obtained that is proportional to the wavelength of the light emitted by the laser. Either the value measured by the wavelength meter or the value of photodiode B divided by photodiode B can be used as the wavelength of the light emitted by the laser.

The main advantage of using the photodiode value for wavelength is that it is much quicker to measure than using a wavelength meter by several orders of magnitude. Then operating points that are adjacent and have a small frequency (or wavelength, as the speed of light divided by the frequency equals wavelength) difference can be joined. This provides a parameter "tuning rate parameter" which is the largest amount the frequencies can differentiate by and still be joined.

When all these points are joined for all phases, they represent the continuous tuning regions of the laser. These lines are then sampled in output frequency of the laser. This is performed by setting a few points on each line on the laser and measuring the output wavelength of the laser. Then by interpolation the desired frequencies can be calculated as the tuning of the laser is continuous between the sample points.

Alternatively, a high finesse fabry perot etalon can be used. Another tap of a portion of the light from the laser is passed through the etalon and then onto a photodiode. As the laser is swept through its continuous wavelength tuning regions, the voltage on the etalon photodiode is monitored. If the etalon is set up to have resonance peaks at the desired wavelength, a peak voltage will be observed on the photodiode and hence the correct wavelengths can be easily located. One such set-up would involve the etalon to be set up for a resonance every 50 Ghz and would locate the wavelengths required for the ITU G692 frequency specification.

This allows the generation of a lookup table of currents where each entry in the table has the required currents on each section so that when set to the laser it will output light at a desired wavelength of light. Typically, this is performed for the ITU G692 frequency specification but can be used to generate any frequency plan required. The advantages of this approach are that it is capable of generating the lookup table using an automated calibration system. This is extremely significant in the manufacture of these devices as the test time required adds a significant cost to the production of tuneable lasers. The ability to generate the lookup table for a device in an automated and fast method allows easy configuration of the diode to the customers requirements and proof of conformance of the laser to a specification.

Also, this system can be used at different stages in production of tuneable lasers to improve the yield at each stage of production. For example, packaging corresponds to about 70% of component cost so when this system is used to test the devices before packaging, a known good device will only be allowed to be packaged where a known good device is one that can achieve the desired frequency output range required. This ensures that the packaging process is as efficient as possible and improves the yield of the device.

It will be appreciated that as the method of the present invention uses only the output power of the laser to identify good stable operating points, that this method provides a fast method of calibration. A frequency reference is required to calibrate the laser to a desired frequency plan and methods are described that allow fast measurement of this. Also, the use of components such as a wavelength locker can be used at this stage to optimise the speed of calibration.

It will be appreciated that the above description is exemplary of the techniques as provided by the present invention and it is not intended to limit the invention to any specific filter technique or other parameter. The above is provided for exemplary purposes only and it will be appreciated that the method of the present invention can be adapted and will perform equally well for any multi-section tuneable laser. Steps implemented according to the method of the invention can be summarised as follows:

1. Measure the output power of the device as a function of the coarse tuning sections (e.g. DBR laser—Bragg Section, SG-DBR laser Front grating and back grating sections, GCSR laser—Coupler and reflector sections)
2. Find the edgemap or discontinuities in the measured data
3. Pick points which are in-between the edges found.
4. Repeat steps 1-3 for different values of fine tuning current (normally wither the phase section or temperature of the diode)
5. Measure the optical frequency of all the points found and join points as a function of the fine tuning current where the tuning is continuous
6. Interpolate/Curvefit the lines found in part 5 to obtain the actual currents to achieve the desired output frequencies of the device
7. If output power control is desired steps 1 to 6 can be repeated for different gain currents.

Then the final points obtained by step 7 can be interpolated between to find the desired output power for each output frequency.

From the above description it will be appreciated that hereintobefore there has been no description of the extension of the present invention to cover situations of hysteresis. Some devices such as DBRs and GCSRs exhibit hysteresis in the Bragg/Reflector section, which means that if the Bragg is ramped up and then down the mode jumps are not in the same region. These regions cannot be used as they are sensitive to the direction of approach and, when switching the laser from one operating point to another, the jump in current could be from either a higher or lower Bragg current. This involves one additional step in that the line in both directions must be measured but the region in-between is easily identified as being stable when the output power is the same in both directions. Then the mode jumps can be identified and then the algorithm can proceed as defined above.

It will be appreciated that the present invention provides for a method that reduces the number of parameters that are required to effect a measurement of stable operating points for a laser diode. The formation of a matrix representing the output of the laser for specific tuning parameters and the selection of specific operating points within the matrix which represent stable operating points for a laser diode at specific operating currents enables a more efficient calibration of the laser.

The words "comprises/comprising" and the words "having/including" when used herein with reference to the present invention are used to specify the presence of stated features, integers, steps or components but does not preclude the presence or addition of one or more other features, integers, steps, components or groups thereof.

The invention claimed is:

1. A method of calibrating a multi-section tuneable laser to a specific frequency, the method comprising the steps of:
   a) measuring output values from the laser as a function of coarse tuning currents of the laser,
   b) forming a first discrete matrix from said output values from the laser, the first discrete matrix being defined by an optical characteristic of the output of the laser at specific determining tuning currents, c) processing the first discrete matrix so as to determine stable operating points within the first discrete matrix, the stable operating points defining specific frequencies where the laser may be operated, and d) determining whether the determined stable operating points represent the optimum stable operating points by the step of:
   i) dilating the set of points that are defined as contributing to an edge in the edge matrix by one pixel so as to widen edges of the matrix, thereby forcing the edges to join where gaps exist,
   ii) determining whether more than one operating point is in each dilated bounded region,
   iii) if more than one operating point is found in the region above it measuring the frequency of the laser at these points, and
   iv) determining whether the difference between the measured frequency of the laser and the mode jump spacing is within a predetermined value and, if it is within the value averaging the plurality of operating points to provide a single operating point within that bounded region or, if it is not within that predetermined value, allowing for a plurality of points within that region.

2. The method as claimed in claim 1 wherein the output values from the laser are measurements indicative of the characteristics of the laser, wherein the characteristics include at least one of:
   a) the output power of the laser,
   b) the wavelength of the laser,
   c) the SMMR of the laser, and
   d) the linewidth.

3. The method as claimed in claim 1 wherein the first discrete matrix may be viewed graphically as a plane of values relating to the output power of the laser at specific controlling tuning parameters.

4. The method as claimed in claim 1 wherein the step of processing the first discrete matrix includes the steps of:
   a) defining regions within the first discrete matrix where an edge or discontinuity is present, and
   b) determining points which are bounded by discontinuities or edges, the points determined representing stable operating regions for the specific tuning parameters.

5. The method as claimed in claim 4 wherein the step of defining regions within the first discrete matrix where an edge of discontinuity is present is performed by effecting an edge detection on the matrix values, the edge detection effecting the formation of a processed matrix set of values, the processed matrix set of values having values indicative of whether an edge is present.

6. The method as claimed in claim 4 wherein the step of defining regions within the first discrete matrix where an edge of discontinuity is present is performed by effecting an edge detection on the matrix values, the edge detection effecting the formation of a processed matrix set of values, the processed matrix set of values having values indicative of whether an edge is present such that the edge detection is effected by one or more of the following steps:
   a) processing the first discrete matrix using a filter algorithm in a direction substantially equivalent to the direction of mode jumps of the laser output,
   b) determining a set of maximum points within the filtered matrix,
   c) determining a set of minimum points within the filtered matrix,
   d) establishing a set of maximum and minimum pairs,
   e) determining the difference between the maximum and minimum of each pair so as to provide a plurality of difference values, and
   f) thresholding the difference values determined such that those values greater than a certain threshold value is defined as an edge within the matrix.

7. The method as claimed in claim 4 wherein the step of defining regions within the first discrete matrix where an edge of discontinuity is present is performed by effecting an edge detection on the first discrete matrix values, the edge detection effecting the formation of a processed matrix set of values, the processed matrix set of values having values indicative of whether an edge is present such that the edge detection is effected by one or more of the following steps:
   a) processing the first discrete matrix using a filter algorithm in a direction substantially equivalent to the direction of mode jumps of the laser output,
   b) determining a set of maximum points within the filtered matrix,
   c) determining a set of minimum points within the filtered matrix,
   d) establishing a set of maximum and minimum pairs,
   e) determining the difference between the maximum and minimum of each pair so as to provide a plurality of difference values, and
   f) thresholding the difference values determined such that those values greater than a certain threshold value is defined as an edge within the matrix wherein the thresholding is performed using the value of the mode jump parameter as a threshold value.

8. The method as claimed in claim 4 wherein the step of defining regions within the first discrete matrix where an edge of discontinuity is present is performed by effecting an edge detection on the first discrete matrix values, the edge detection effecting the formation of a processed matrix set of values, the processed matrix set of values having values indicative of whether an edge is present such that the edge detection is effected by one or more of the following steps:
   a) processing the first discrete matrix using a filter algorithm in a direction substantially equivalent to the direction of mode jumps of the laser output,
   b) determining a set of maximum points within the filtered matrix,
   c) determining a set of minimum points within the filtered matrix,
   d) establishing a set of maximum and minimum pairs,
   e) determining the difference between the maximum and minimum of each pair so as to provide a plurality of difference values, and
   f) thresholding the difference values determined such that those values greater than a certain threshold value is defined as an edge within the matrix wherein the thresholding is performed using the value of the mode jump parameter as a threshold value wherein the value of the mode jump parameter selected is selected by selecting a sequence of values and selecting the value which provides the best result.

9. The method as claimed in claim 1 wherein the step of determining stable operating points within the matrix set of values is effected by performing a distance map operation on the processed matrix set so as to determine distances between adjacent edges and selecting those points which are in the center of the region bounded by the edges.

10. The method as claimed in claim 1 comprising the repetition of the one or more of the preceding steps at different tuning parameters so as to provide a plurality of matrices, each matrix being indicative of a set of operating points for a particular set of tuning parameters and the linking of operating points from different matrices so as to form a continuous tuning region.

11. The method as claimed in claim 1 comprising the repetition of the one or more of the preceding steps at different tuning parameters so as to provide a plurality of matrices, each matrix being indicative of a set of operating points for a particular set of tuning parameters and the linking of operating points from different matrices so as to form a continuous tuning region wherein the linking of points from different matrices is effected by joining points that meet the criteria that a point from a first matrix and a point from a second matrix are joined if the point from the second matrix has a larger front and back current but these currents are within a predetermined distance value of the two operating points.

12. The method as claimed in claim 1 comprising the repetition of the one or more of the preceding steps at different tuning parameters so as to provide a plurality of matrices, each matrix being indicative of a set of operating points for a particular set of tuning parameters and the linking of operating points from different matrices so as to form a continuous tuning region wherein the frequency of each operating point is measured and those operating points that are adjacent and have a frequency difference within a predetermined range are joined.

13. The method as claimed in claim 1 comprising the further steps of:
   e) measuring the output power of the device as a function of the coarse tuning sections,
   f) determining an edgemap or discontinuities in the measured data,
   g) defining points which are in-between the edges found,
   h) repeating steps (a)-(c) for different values of fine tuning current, and
   i) joining points so as to form continuous lines, the lines being determined as a function of a fine tuning current where the wavelength tuning of the laser is continuous, and being indicative of regions of continuous tuning of the laser.

14. The method as claimed in claim 13 further including the step of: interpolating the lines found in step (e) to obtain the actual currents to achieve the desired output frequencies of the device.

15. The method as claimed in claim 13 further including the step of: interpolating the lines found in step (e) to obtain the actual currents to achieve the desired output frequencies of the device and sampling the wavelength along the continuous lines prior to the interpolation.

16. The method as claimed in claim 13 further comprising the steps of:
   coupling a portion of the laser light through a high finesse filter onto a photodiode, the high finesse filter being configured such that the peaks in its transmitivity are located at desired calibration frequencies of the laser, and
   scanning the laser across each of the lines found in step (e) while monitoring the output of a photodiode, and wherein the presence of a detected output of the photodiode indicating light is present at the output of the filter is indicative that the laser is at a required frequency for the calibration, the currents on the laser for those required frequencies being recordable so as to provide for a generation of a lookup table for the laser.

17. The method as claimed in claim 13 wherein if output power control is desired, any of the steps (a)-(e) are repeated for different gain currents, and the final points obtained are interpolated to find a desired output power for each output frequency.

* * * * *